(12) United States Patent
Sargand et al.

(10) Patent No.: US 9,389,271 B2
(45) Date of Patent: Jul. 12, 2016

(54) SECURITY SYSTEM FOR UNDERGROUND CONDUIT

(75) Inventors: Shad M. Sargand, Athens, OH (US); Gayle F. Mitchell, Athens, OH (US)

(73) Assignee: Ohio University, Athens, OH (US)

( * ) Notice: Subject to any disclaimer, the term of this patent is extended or adjusted under 35 U.S.C. 154(b) by 75 days.

(21) Appl. No.: 14/006,517

(22) PCT Filed: Mar. 26, 2012

(86) PCT No.: PCT/US2012/030533
§ 371 (c)(1),
(2), (4) Date: Dec. 18, 2013

(87) PCT Pub. No.: WO2012/135103
PCT Pub. Date: Oct. 4, 2012

(65) Prior Publication Data
US 2014/0091809 A1    Apr. 3, 2014

Related U.S. Application Data

(60) Provisional application No. 61/467,461, filed on Mar. 25, 2011.

(51) Int. Cl.
*G01R 31/11*    (2006.01)
*G01R 31/02*    (2006.01)

(52) U.S. Cl.
CPC .............. *G01R 31/11* (2013.01); *G01R 31/021* (2013.01)

(58) Field of Classification Search
None
See application file for complete search history.

(56) References Cited

U.S. PATENT DOCUMENTS 4,197,529 A * 4/1980 Ramstedt ............... G08B 13/26
174/102 R
4,326,272 A * 4/1982 Rittenbach .............. G01S 13/56
181/123

(Continued)

FOREIGN PATENT DOCUMENTS

WO        2010139934        9/2010

OTHER PUBLICATIONS

International Preliminary Report on Patentability dated Mar. 18, 2014, for corresponding International Application No. PCT/US2012/030533.

(Continued)

*Primary Examiner* — Jermele M Hollington
*Assistant Examiner* — Suresh K Rajaputra
(74) *Attorney, Agent, or Firm* — Calfee, Halter & Griswold LLP

(57) ABSTRACT

In a method for detecting disruptions proximate to an underground conduit, at least one signal carrying cable is positioned along a length of the conduit and between the conduit and a ground surface. At least one cable engaging member is connected to spaced apart locations on the at least one signal carrying cable to extend laterally outward of the at least one signal carrying cable. Each of the at least one cable engaging members is configured to transmit a force to the at least one signal carrying cable when impacted by an external force. A monitoring signal is provided to the at least one signal carrying cable, and a reflected monitoring signal is received in response to the supplied monitoring signal. One or more properties of the reflected monitoring signal are compared to one or more corresponding properties of a predicted reflected monitoring signal. An alert is initiated when the one or more properties of the reflected monitoring signal differ from the one or more properties of the predicted reflected monitoring signal by a predetermined amount.

21 Claims, 2 Drawing Sheets

(56) References Cited

U.S. PATENT DOCUMENTS

| | | | | |
|---|---|---|---|---|
| 4,400,695 | A | * | 8/1983 | Rittenbach .............. G01S 13/56 181/122 |
| 4,401,980 | A | * | 8/1983 | Rittenbach .............. G01S 13/56 340/524 |
| 4,450,434 | A | * | 5/1984 | Nielsen ................ G08B 13/124 250/227.15 |
| 4,458,240 | A | * | 7/1984 | Rittenbach .............. G01S 13/56 340/552 |
| 4,949,076 | A | * | 8/1990 | Wann ..................... G01M 3/185 324/533 |
| 5,134,377 | A | * | 7/1992 | Reddy, III ............. G01M 3/165 324/533 |
| 5,705,984 | A | * | 1/1998 | Wilson ............... G08B 13/2497 340/552 |
| 6,002,501 | A | * | 12/1999 | Smith ..................... G01M 3/28 356/44 |
| 6,114,857 | A | * | 9/2000 | Kohl ......................... E21B 1/02 204/404 |
| 6,621,947 | B1 | * | 9/2003 | Tapanes ............... G01M 5/0025 250/227.14 |
| 6,934,426 | B2 | * | 8/2005 | Rich .................... G02B 6/4469 385/102 |
| 7,143,545 | B2 | * | 12/2006 | Meyer .................. B60R 25/016 49/15 |
| 7,184,907 | B2 | * | 2/2007 | Chun .................... G08B 13/186 702/69 |
| 7,257,280 | B1 | * | 8/2007 | Karpati ................ G02B 6/4463 385/100 |
| 7,479,878 | B2 | * | 1/2009 | Maki ................... G08B 13/124 340/552 |
| 7,711,264 | B1 | * | 5/2010 | Eslambolchi ........ G08B 13/186 385/12 |
| 7,714,719 | B2 | * | 5/2010 | Duff ........................ G01S 13/56 340/426.1 |
| 7,777,496 | B2 | * | 8/2010 | Evans ..................... G01N 21/84 324/534 |
| 7,830,273 | B2 | | 11/2010 | Twitchell, Jr. |
| 7,946,341 | B2 | * | 5/2011 | Hartog .................... E21B 43/26 166/254.1 |
| 8,604,911 | B2 | * | 12/2013 | Niktash ................ H04B 5/0056 340/10.1 |
| 8,770,283 | B2 | * | 7/2014 | Hartog et al. ............ 166/250.01 |
| 8,947,232 | B2 | * | 2/2015 | Strong ................... G01H 9/004 250/216 |
| 2002/0107428 | A1 | * | 8/2002 | Nickelson ................ B09B 1/00 588/256 |
| 2002/0161539 | A1 | * | 10/2002 | Jones ..................... H04B 3/493 702/79 |
| 2003/0010500 | A1 | * | 1/2003 | Smith ................. E21B 47/0001 166/336 |
| 2003/0020610 | A1 | * | 1/2003 | Swanson ............ G08B 13/1609 340/566 |
| 2005/0024210 | A1 | * | 2/2005 | Maki ..................... G08B 13/124 340/566 |
| 2005/0077455 | A1 | * | 4/2005 | Townley-Smith ... G08B 13/186 250/227.27 |
| 2005/0152700 | A1 | * | 7/2005 | Fling ....................... H04B 10/85 398/135 |
| 2005/0254767 | A1 | * | 11/2005 | Chun .................... G08B 13/186 385/136 |
| 2006/0054796 | A1 | * | 3/2006 | Chun .................... G08B 13/186 250/227.15 |
| 2006/0083458 | A1 | * | 4/2006 | Iffergan ............... G02B 6/4469 385/13 |
| 2006/0115228 | A1 | * | 6/2006 | Iffergan ............... G02B 6/4471 385/136 |
| 2006/0250263 | A1 | * | 11/2006 | Chun .................... G02B 6/4469 340/652 |
| 2007/0247631 | A1 | * | 10/2007 | Paulson ................. G01M 3/047 356/483 |
| 2007/0251326 | A1 | * | 11/2007 | Mathis ..................... G01D 5/16 73/760 |
| 2008/0191706 | A1 | | 8/2008 | Burnett et al. |
| 2008/0297772 | A1 | * | 12/2008 | Rogers .............. G01M 11/3118 356/73.1 |
| 2009/0014634 | A1 | * | 1/2009 | Sikora ................ G01M 11/3145 250/227.14 |
| 2009/0219516 | A1 | * | 9/2009 | Bookbinder ............ G01L 1/242 356/73.1 |
| 2009/0285520 | A1 | * | 11/2009 | Kaplan ................ G01M 11/083 385/12 |
| 2009/0301777 | A1 | * | 12/2009 | Yribarren .................. F16L 7/00 174/99 R |
| 2011/0194102 | A1 | * | 8/2011 | Richardson et al. ......... 356/73.1 |
| 2011/0227753 | A1 | * | 9/2011 | Iffergan ................... B63G 9/04 340/850 |

OTHER PUBLICATIONS

International Search Report dated Jul. 2, 2012, for corresponding International Application No. PCT/US2012/030533.

Written Opinion dated Jul. 2, 2012, for corresponding International Application No. PCT/US2012/030533.

* cited by examiner

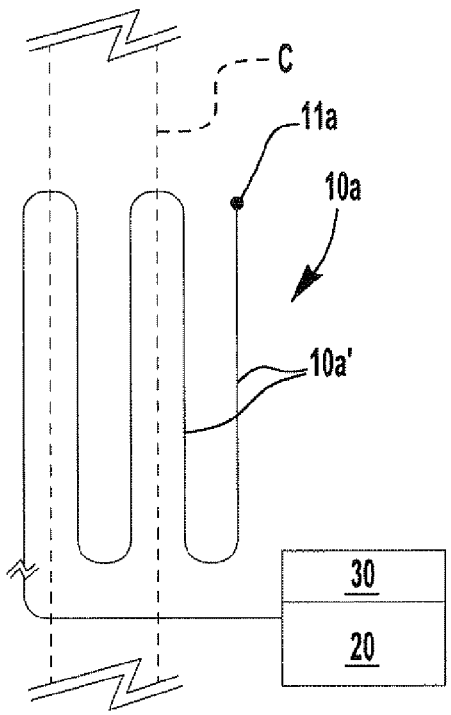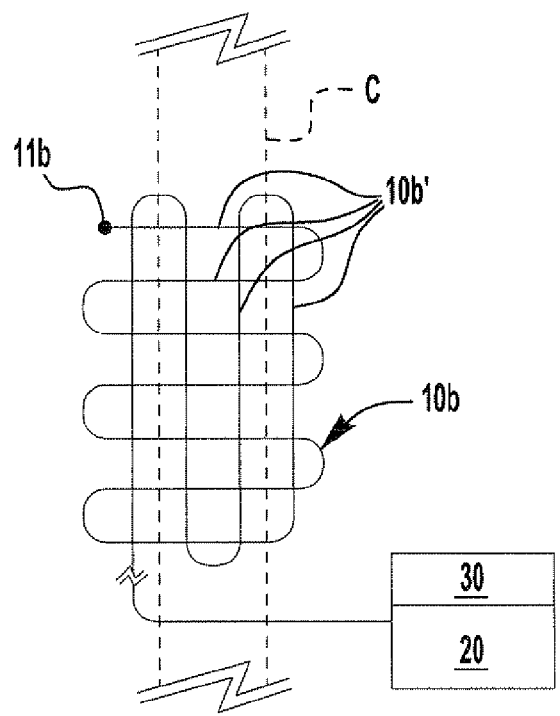
FIG. 1A
FIG. 1B
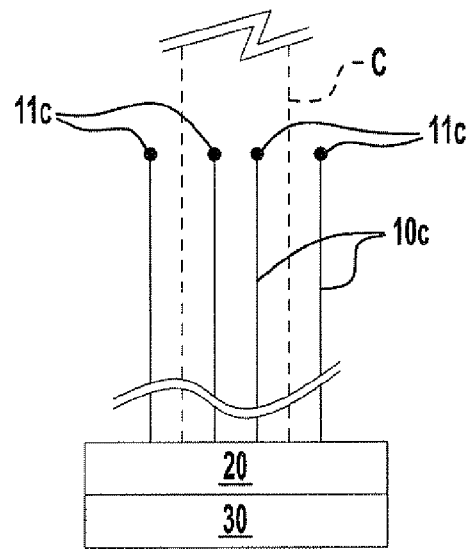
FIG. 1C

SECURITY SYSTEM FOR UNDERGROUND CONDUIT

CROSS-REFERENCE TO RELATED APPLICATION

This application claims the benefit of U.S. Provisional Patent Application Ser. No. 61/469,461, entitled "SECURITY SYSTEM FOR UNDERGROUND CONDUIT" and filed Mar. 25, 2011, the entire disclosure of which is incorporated herein by reference, to the extent that it is not conflicting with the present application.

BACKGROUND

Underground conduits, such as, for example, fiber-optic or coaxial cables, power lines, telephone lines, and pipelines for water, sewage, gas, or other fluids, are often susceptible to accidental or malicious damage resulting from drilling, excavation, or explosives, or unanticipated damage from tree root growth, seismic activity, ground settlement, failure of backfill material, or other natural events. The resulting system failures (e.g., loss of power/signal, environmental leakage) may remain undetected and/or un-locatable within the conduit system, as the damaged portion of the conduit may not be visible. One example of a particularly serious risk involves the rupture of underground natural gas pipelines, where undetected leakage may result in fires or explosions, and a substantial toll in loss of life and property damage. Underground leakage of other combustible or toxic fluids may present similar undetected hazards.

SUMMARY

The present application describes systems and methods for monitoring an area proximate a structure to be protected (a "protected structure") to detect disturbances or intrusions that may cause, may have already caused, or may be the result of damage to the structure. While many types of structures may be protected by such monitoring, in one embodiment, an underground conduit, such as a natural gas pipeline, is monitored using one or more of the systems and methods described herein.

Accordingly, in one embodiment, a system for monitoring a protected structure includes at least one signal carrying cable, a signal generating mechanism, a signal measuring mechanism, and at least one cable engaging member. The signal generating mechanism is in electrical communication with the at least one signal carrying cable and is configured to provide a monitoring signal on the at least one signal carrying cable. The signal measuring mechanism (which may, but need not, be integral with the signal generating mechanism in a single device) is in electrical communication with the at least one signal carrying cable and is configured to receive a reflected monitoring signal from the at least one signal carrying cable in response to the monitoring signal. The signal measuring mechanism is configured to compare one or more properties of the reflected monitoring signal (for example, timing or magnitude of the signal) with one or more corresponding properties of a predicted reflected monitoring signal. The signal measuring mechanism is further configured to initiate an alert when the one or more properties of the reflected monitoring signal differ from the one or more properties of the predicted reflected monitoring signal by a predetermined amount. The at least one cable engaging member is connected to spaced apart locations on the at least one signal carrying cable. A force applied to one of the at least one cable engaging members (for example, by excavation or some other external impact) is transmitted to the at least one signal carrying cable to alter the at least one signal carrying cable at the corresponding spaced apart location. This alteration or disruption in the at least one signal carrying cable alters the reflected monitoring signal, such that the properties of the reflected monitoring signal differ from the properties of the predicted reflected monitoring signal.

In a method of detecting disruptions proximate to an underground conduit in accordance with aspects of the present application, at least one signal carrying cable is positioned along a length of the conduit and between the conduit and a ground surface. At least one cable engaging member connected to spaced apart locations on the at least one signal carrying cable is positioned to extend laterally outward of the at least one signal carrying cable. Each of the at least one cable engaging members is configured to transmit a force to the at least one signal carrying cable when impacted by an external force. A monitoring signal is provided to the at least one signal carrying cable, and a reflected monitoring signal is received in response to the supplied monitoring signal. One or more properties of the reflected monitoring signal are compared to one or more corresponding properties of a predicted reflected monitoring signal. An alert is initiated when the one or more properties of the reflected monitoring signal differ from the one or more properties of the predicted reflected monitoring signal by a predetermined amount.

BRIEF DESCRIPTION OF THE DRAWINGS

Further features and advantages will become apparent from the following detailed description made with reference to the accompanying drawings, wherein:

FIG. 1A is a schematic view of a monitoring system for an underground conduit;

FIG. 1B is a schematic view of another monitoring system for an underground conduit;

FIG. 1C is a schematic view of still another monitoring system for an underground conduit;

DETAILED DESCRIPTION

Figure 2:
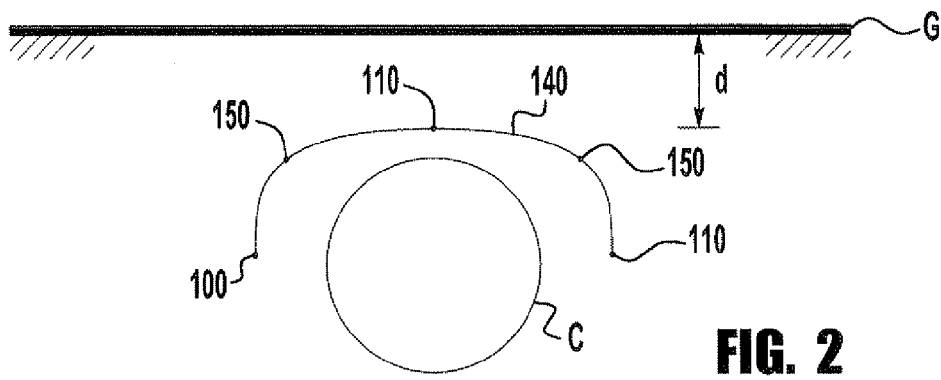
FIG. 2 is an end schematic view of a signal carrying cable grid arrangement for a monitoring system for an underground conduit.

This Detailed Description merely describes embodiments of the invention and is not intended to limit the scope of the claims in any way. Indeed, the invention as claimed is broader than and unlimited by the preferred embodiments, and the terms used in the claims have their full ordinary meaning. For example, while specific embodiments shown and described in the present application relate to security systems for underground natural gas pipelines, the inventive features described herein may be applied to security systems for other types of conduits (for example, coaxial cables, fiber-optic cables, power lines, telephone lines, tubing, and hose), other structures (for example, containers, equipment), and in other locations (for example, above ground, or within building walls or roofing).

The present application describes a monitoring system configured to provide an alert of a physical breach or intrusion of an area in which a conduit or other structure is disposed, to notify a user or administrator that the conduit or other structure may be damaged or may be at risk of becoming damaged. According to an aspect of the present application, the security system includes at least one signal carrying cable (for example, Belden Coaxial 89907) in communication with a signal generating mechanism and a signal receiving mechanism (which may, but need not, be disposed in the same device). The signal generating mechanism may be configured to generate a monitoring signal (for example, an electromagnetic wave) for transmission along the signal carrying cable to a feedback location (for example, an open or terminating end of the signal carrying cable), from which a reflection of the security signal is delivered along the signal carrying cable back to a signal measuring mechanism.

Based on the timing and magnitude of the reflected signal, the signal measuring mechanism can confirm that the signal carrying cable remains unaltered (for example, not broken or bent). In the event that the signal carrying cable is severed, damaged, bent, or otherwise altered (for example, due to natural, accidental, or malicious events, as mentioned above, that disturb an area around a structure to be protected), an altered feedback signal will be reflected back to the signal measuring mechanism. The signal measuring mechanism may be configured to determine, based on the timing and magnitude of the reflected signal, the affected location on the signal carrying cable, and consequently, the physical location of the disturbance.

An exemplary device for determining a location of a discontinuity in a signal carrying cable based on a reflected signal is a time domain reflectometer (TDR). In an exemplary embodiment, electromagnetic pulses are continuously or periodically generated (for example, every ten seconds, every minute, or as prompted by a user) by a reflectometer and delivered along one or more transmission lines. The reflectometer receives reflected electromagnetic pulses from the transmission lines and records the elapsed times between the generation of the electromagnetic pulses and the receipt of the corresponding reflected pulses. The reflectometer may also evaluate the voltage of the reflected pulse, for example, as a ratio of the voltage of the generated pulse, or reflection coefficient. An example of a commercially available reflectometer that may be programmed or configured to supply a monitoring signal and receive and measure a reflected signal as described herein is the Campbell Scientific TDR100 with CR 10 logger.

When a transmission line is unaltered, the electromagnetic pulse travels to an end of the transmission line and is then reflected back to the reflectometer, which should measure an elapsed time and voltage of the reflected pulse that is within a nominal tolerance of a predicted elapsed time and voltage for the transmission line. When a transmission line has been severed, the electromagnetic pulse travels to the severed portion of the transmission line and is reflected back to the reflectometer, resulting in a reduction in the elapsed time between generation of the monitoring signal and receipt of the reflected signal. When a transmission line has been partially damaged or bent, or subjected to some other discontinuity, a change in the impedance at the affected portion of the transmission line causes a portion of the electromagnetic pulse to be reflected back to the reflectometer.

To evaluate the condition of the transmission lines, data received by the reflectometer or other such receiver may be delivered to and stored by a data logger for periodic collection and analysis. The data may additionally or alternatively be delivered to a computer (for example, by a wired connection or by wireless communication) for storage and analysis, either via the data logger or directly from the receiver. Software may be utilized to collect, evaluate, and communicate critical information related to the collected data. An example of a commercially available software package is Loggernet from Campbell Scientific, which supports programming, communication, and data retrieval between data loggers and a computer system. A program for monitoring the collected data (written, for example, using Microsoft Visual Studio or some other suitable application development software) may be prepared to evaluate the collected data and identify discontinuities suggesting potential damage to a monitored structure. Using predetermined cable lengths and nominal electromagnetic pulse wave magnitudes and velocities, predicted elapsed times and reflection coefficients for reflected electromagnetic pulses may be established for each of the transmission cables.

The program may include one or more flags or alerts that are activated when at least one of the collected elapsed times and reflection coefficients differs from the predicted elapsed times and reflection coefficients by a predetermined nominal tolerance, to identify a detected discontinuity in the monitoring cable transmission line. The program may be configured such that an activated flag prompts the communication of an alarm or warning message to a user. This warning message may be provided by the monitoring computer itself, for example, on an associated monitor display or as an audible alert (for example, a voice message or siren) through a connected speaker. Additionally or alternatively, a warning message may be delivered to an administrator or user's computer, telephone, smart phone, or other device, for example, by phone line, data line, Internet, or wireless electronic communication, to reach a user off-site, for example, in the form of audible sirens or alarms, indicator lights, console or monitor displays, e-mail messages, text messages, other wireless communication, or automated telephone messages. The signal measuring mechanism may be configured to repeat the alert until the altered signal carrying cable has been repaired, replaced, or otherwise corrected, or until the alert condition has been acknowledged by or manually reset by the user or administrator.

As discussed above, a change in a measured reflection coefficient at a time corresponding to electromagnetic wave travel on only a portion of the signal carrying cable (instead of to the end of the signal carrying cable and back) identify both the existence of a discontinuity in the cable, as well as an approximate location of the discontinuity. The monitoring system (for example, the data monitoring program) may be further configured to identify a location of a detected discontinuity, calculated using the measured elapsed time of the deviating reflected pulse and the nominal velocity of the pulse. Additionally or alternatively, the monitoring system may be configured to identify the type of discontinuity to the monitoring cable based on the magnitude of the deviating reflected pulse. For example a cut or severed wire may produce a reflected signal of a larger voltage or reflection coefficient, while a bend in the wire may produce an initial reflected signal of a smaller voltage or reflection coefficient, followed by a subsequent reflected signal corresponding to the portion of the pulse travelling to the end of the cable. This additional information regarding the location and type of discontinuity may be provided in the alert communication described above.

Any suitable signal carrying cable arrangement may be utilized to monitor a protected area in which a structure is disposed. As one example, a coaxial cable may be arranged to carry electromagnetic wave signals generated by a signal generating mechanism in communication with the signal carrying cable. As another example, a fiber-optic cable may be arranged to carry optic wave signals generated by a signal generating mechanism in communication with the signal carrying cable.

To monitor the integrity of a structure to be protected, a signal carrying cable may be positioned to extend along a length of the structure at a desirable distance from the structure. As one example, the integrity of an underground pipeline may be monitored by positioning a signal carrying cable underground and directly above the pipeline, such that the signal carrying cable runs substantially parallel to the pipeline. While a single, linear signal carrying cable extending the length of the pipeline may be sufficient to reliably provide an alert of substantial excavation or vertical digging directly above the pipeline, the peripheral exposure of the pipeline to impacts from directions other than directly above the pipeline (for example, beside or below the pipeline) may leave the pipeline vulnerable to undetected damage caused by impacts from these other directions.

Accordingly, in another embodiment, one or more signal carrying cables form multiple monitoring lines or segments above or around a structure to detect more reliably intrusions or disturbances proximate to the structure. In one such embodiment, one or more signal carrying cables can be arranged to form an array or grid over or around the protected structure. As one example, a single signal carrying cable 10a, 10b connected with a signal generating mechanism 20 and a signal measuring mechanism 30 may be looped or coiled to form an array or grid of monitoring lines 10a', 10b' terminating at a feedback location 11a, 11b, as shown schematically in FIGS. 1A and 1B. As another example, shown schematically in FIG. 1C, multiple signal carrying cables 10c, each forming one or more separate monitoring lines terminating at feedback locations 11c, may be independently connected with a signal generating mechanism 20 and a signal measuring mechanism 30, for example, using a multiplexer, to independently measure each of the monitoring lines. By providing multiple lines or segments, the likelihood of excavation, drilling, or some other intrusion impacting the protected structure without altering the monitoring lines (and consequently, the reflected monitoring signals) is reduced or minimized. For greater security, the number of monitoring lines may be increased, the spacing between the monitoring lines may be reduced, and the portion of the structure covered or surrounded by the monitoring lines may be increased.

To provide further advance notice of an intrusion or disturbance proximate the protected structure, monitoring lines 110 may be positioned at a distance d nearer to an outer surface G of the ground (or wall, floor, roof, or other environmental structural surface), and may extend around a portion of the circumference of the structure C, as shown in FIG. 2. Still further, multiple layers of monitoring lines may be provided above the protected structure, to provide an indication of the relative depth or proximity of the disturbance or intrusion, or to provide an indication of the source of the disturbance. For example, if an altered reflected signal is detected from an outer layer of monitoring lines but not from an inner layer of monitoring lines, the measured results may tend to indicate that drilling or excavation has commenced proximate to the protected structure, but has not yet reached the protected structure. As another example, if an altered reflected signal is detected from an inner layer of monitoring lines but not from an outer layer of monitoring lines, the measured results may tend to indicate that the disturbance originated underground, perhaps from the protected structure itself.

A substantial number or length of signal carrying cable may be utilized over or around a protected structure to provide a dense (and therefore more secure) array, grid, or layer of monitoring lines positioned to detect disturbances in the area surrounding the protected structure. According to another aspect of the present application, a monitoring system may be configured to identify disturbances or intrusions that occur proximate to a signal carrying cable but that do not directly impact the signal carrying cable. In one embodiment, one or more cable engaging members may be connected with the signal carrying cable, such that when one of the cable engaging members is impacted, the cable engaging member transmits a force (e.g., a bending, pulling, or pushing force) to the signal carrying cable to produce a detectable disruption in the signal carrying cable, resulting in an alteration of the reflected monitoring signal to the signal measuring mechanism to identify the existence of the disruption and the approximate location of the disruption.

Many different types of cable engaging members may be connected with the signal carrying cables to facilitate the identification of nearby disturbances. For example, one or more cords, plates or flexible sheets of material may be connected to the signal carrying cables at one or more locations. The cable engaging members may be provided in an inert, non-conductive, and durable material that is resistant to environmental degradation, with a tensile strength and impact resistance sufficient to absorb external impacts and transmit tensile forces to the signal carrying cable or cables. Examples of suitable materials include Kevlar® fiber strands, such as Phillystran® PS29-B150.

Figure 3:
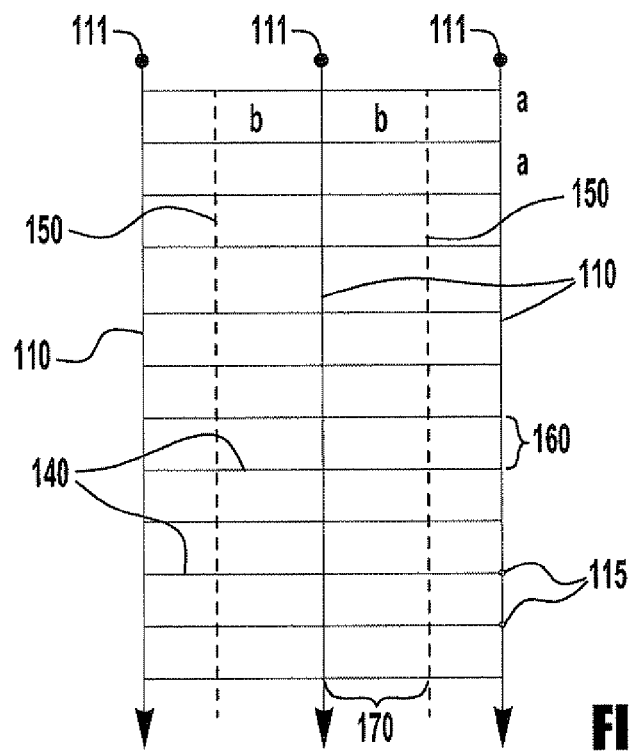
FIG. 3 is a top schematic view of the signal carrying cable grid of FIG. 2.
Figure 4:
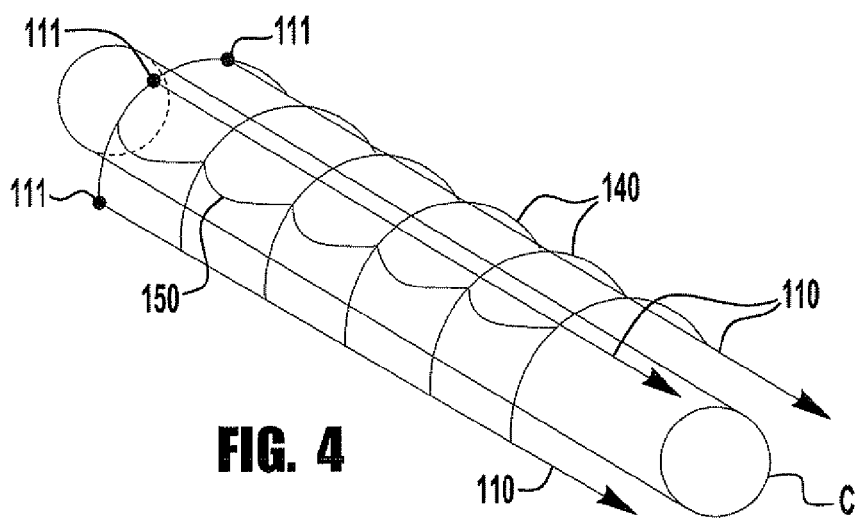
FIG. 4 is an upper perspective view of the signal carrying cable grid of FIG. 2.

In one such embodiment, as shown in FIGS. 2, 3, and 4, signal carrying cables 110 for connection with signal generating and signal measuring mechanisms (for example, in a time domain reflectometer) are connected or woven with nonconductive cords 140 to fowl a mesh, grid, or web of active (signal carrying) monitoring segments 160 and non-active (nonconductive) monitoring segments 170 that can be positioned around a pipeline C or other protected structure. The cables 110 terminate at feedback locations 111. The cables 110 may be connected to the signal generating and signal measuring mechanisms by a multiplexer (not shown) to accept inputs from the multiple cables simultaneously. When one of the non-active monitoring segments 170 is impacted, resulting tension in the non-conductive cord transmits a force to the signal carrying cable at a node 115 or connection point between the cord 140 and the cable 110. This node 115 may be configured to facilitate sufficient alteration of the signal carrying cable 110 (for example, causing breakage, bending, or kinking of the cable, or removal or damage to the insulating sheath) at the node 115 to produce an altered monitoring signal reflected back to the signal measuring mechanism. For example, the cord 140 may be fastened to an outer surface of the cable or may be connected directly to the conductive core of the cable. In another embodiment, the end or connecting portion of the cord 140 may be provided with a conductive connector that connects adjacent segments of the signal carrying cable 110 when the cord 140 is in a normal installed condition, but disconnects the adjacent segments when tension is applied to the cord 140.

As shown, the cords 140 may be positioned to be substantially perpendicular to the signal carrying cables 110 and extend laterally from the cables 110, forming a grid. The spacing between the cables 110 and between the cords 140 may be selected to provide a desired density of monitoring segments for sufficient protection of the area proximate the protected structure. To reduce the amount of cabling required for sufficient monitoring of the area, additional cords 150 (or other cable engaging members) may be positioned parallel to and disposed between the signal carrying cables 110 for direct connection with the perpendicular cords 140 and indirect connection with the signal carrying cables 110. In addition to transmitting forces to the signal carrying cables 110, the cords 140 may facilitate installation of the monitoring system by providing uniform spacing between the cables 110, and by allowing the uninstalled web to be stored and dispensed from a single roll or spool.

In addition to, or as an alternative to, electrically detecting physical disruptions proximate to an underground conduit, as described herein, leakage from an underground conduit may be detected electrically. As one example, a security system installed proximate to the conduit may be provided with one or more acoustic sensors configured to detect sound waves emitted by a leaking fluid. The sensors may deliver signals identifying this leak on a signal carrying cable to a signal measuring mechanism to provide an additional or alternative alert identifying conduit damage. Use of such sensors is described in greater detail in the following references, which are incorporated by reference as if fully set forth herein: Brunner, A. J. and Barbezat, M., Acoustic Emission Monitoring of Leaks in Pipes for Transport of Liquid and Gaseous Media: A Model Experiment, v 13-14, p 351-356, Acoustic Emission Testing-Proceedings of the $27^{th}$ European Conference on Acoustic Emission Testing, EWGAE 2006, Sep. 20, 2006-Sep. 22, 2006; Dipen N. Sinha, Acoustic Sensor for Pipeline Monitoring Technology Report, LA-UR-05-6025, Los Alamos National Laboratory, Jul. 20, 2005.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure; however, such values and ranges are not to be construed in a limiting sense and are intended to be critical values or ranges only if so expressly stated. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention. Descriptions of exemplary methods or processes are not limited to inclusion of all steps as being required in all cases, nor is the order that the steps are presented to be construed as required or necessary unless expressly so stated.

What is claimed is:

1. A system for monitoring a protected structure, the system comprising:
   at least one signal carrying cable having at least a first portion extending linearly along a first length;
   a signal generating mechanism in electrical communication with the at least one signal carrying cable and configured to provide a monitoring signal on the at least one signal carrying cable;
   a signal measuring mechanism in electrical communication with the at least one signal carrying cable and configured to receive a reflected monitoring signal from the at least one signal carrying cable in response to the monitoring signal, the signal measuring mechanism comparing one or more properties of the reflected monitoring signal with one or more corresponding properties of a predicted reflected monitoring signal, the signal measuring mechanism being further configured to initiate an alert when the one or more properties of the reflected monitoring signal differ from the one or more properties of the predicted reflected monitoring signal by a predetermined amount; and
   at least one elongated flexible engaging member connected to a plurality of spaced apart locations along the first portion of the at least one signal carrying cable and extending laterally outward of the plurality of spaced apart locations, such that the at least one signal carrying cable and the at least one flexible engaging member together define an array of monitoring segments, with the first portion of the at least one signal carrying cable defining longitudinally extending active monitoring segments extending between adjacent ones of the plurality of spaced apart locations, and portions of the at least one flexible engaging member connected to the plurality of spaced apart locations defining laterally extending non-active monitoring segments, wherein a pulling force applied to one of the non-active monitoring segments is transmitted to the corresponding spaced apart location to alter the at least one signal carrying cable at the corresponding spaced apart location, thereby altering the reflected monitoring signal, such that the properties of the reflected monitoring signal differ from the properties of the predicted reflected monitoring signal.

2. The system of claim 1, wherein the signal measuring mechanism is further configured to determine the altered location on the at least one signal carrying cable based on the properties of the reflected monitoring signal.

3. The system of claim 1, wherein the at least one flexible engaging member comprises a cord.

4. The system of claim 1, wherein the at least one signal carrying cable comprises a plurality of substantially parallel signal carrying cables.

5. The system of claim 4, wherein the at least one flexible engaging member comprises a plurality of flexible engaging members, and wherein each of the plurality of flexible engaging members is connected with each of the plurality of signal carrying cables.

6. The system of claim 4, wherein the at least one flexible engaging member comprises a plurality of flexible engaging members, and wherein the plurality of flexible engaging members and the plurality of signal carrying cables form a monitoring grid.

7. The system of claim 1, wherein at least a portion of the at least one flexible engaging member extends substantially parallel to the at least one signal carrying cable.

8. The system of claim 1, wherein at least a portion of the at least one flexible engaging member extends substantially perpendicular to the at least one signal carrying cable.

9. The system of claim 1, wherein the alert comprises at least one of an audible alarm, indicator light, console display, e-mail message, text message, or automated telephone message.

10. The system of claim 1, wherein the at least one signal carrying cable comprises a coaxial cable.

11. The system of claim 1, wherein the at least one signal carrying cable comprises a fiber-optic cable.

12. The system of claim 1, wherein the one or more properties comprise at least one of timing of the reflected monitoring signal and magnitude of the reflected monitoring signal.

13. A method for detecting disruptions proximate to an underground conduit, the method comprising:
positioning at least one signal carrying cable along a length of the conduit and between the conduit and a ground surface;
positioning at least one elongated flexible engaging member connected to spaced apart locations on a linearly extending first portion of the at least one signal carrying cable to extend laterally outward of the linearly extending first portion of the at least one signal carrying cable, such that the at least one signal carrying cable and the at least one flexible engaging member together define an array of monitoring segments, with the first portion of the at least one signal carrying cable defining longitudinally extending active monitoring segments extending between adjacent ones of the plurality of spaced apart locations, and portions of the flexible engaging member connected to the plurality of spaced apart locations defining laterally extending non-active monitoring segments, wherein each of the non-active monitoring segments is configured to transmit a pulling force to the corresponding spaced apart location when impacted by an external force;
providing a reflected monitoring signal in response to the supplied monitoring signal;
comparing one or more properties of the reflected monitoring signal to one or more corresponding properties of a predicted reflected monitoring signal; and
initiating an alert when the one or more properties of the reflected monitoring signal differ from the one or more properties of the predicted reflected monitoring signal by a predetermined amount.

14. The method of claim 13, further comprising determining a location of a disruption in the at least one signal carrying cable based on a detected difference between the one or more properties of the reflected monitoring signal and the one or more corresponding properties of the predicted reflected monitoring signal.

15. The method of claim 14, wherein the determined location corresponds with one of the spaced apart locations on the at least one signal carrying cable.

16. The method of claim 13, wherein a force transmitted to one of the plurality of spaced apart locations alters the reflected monitoring signal, such that the one or more properties of the reflected monitoring signal differ from the one or more properties of the predicted reflected monitoring signal.

17. The method of claim 13, wherein positioning the at least one signal carrying cable along the length of the conduit comprises positioning a plurality of signal carrying cables in a substantially parallel array.

18. The method of claim 17, wherein the at least one flexible engaging member comprises a plurality of flexible engaging members extending laterally with respect to the plurality of signal carrying cables, thereby forming a monitoring grid.

19. The method of claim 13, further comprising delivering the alert signal to a user by wireless communication.

20. A conduit monitoring system comprising:
an underground conduit;
at least one signal carrying cable positioned outward of the underground conduit extending along a length of the underground conduit;
a signal generating mechanism in electrical communication with the at least one signal carrying cable and configured to provide a monitoring signal on the at least one signal carrying cable;
a signal measuring mechanism in electrical communication with the at least one signal carrying cable and configured to receive a reflected monitoring signal from the at least one signal carrying cable in response to the monitoring signal; and
at least one elongated flexible engaging member connected to spaced apart locations on a linearly extending first portion of the at least one signal carrying cable and extending laterally outward of the at least one signal carrying cable, such that the at least one signal carrying cable and the at least one flexible engaging member together define an array of monitoring segments, with the first portion of the at least one signal carrying cable defining longitudinally extending active monitoring segments extending between adjacent ones of the plurality of spaced apart locations, and portions of the flexible engaging member connected to the plurality of spaced apart locations defining laterally extending non-active monitoring segments, wherein a pulling force applied to one of the non-active monitoring segments is transmitted to the at least one signal carrying cable to alter the at least one signal carrying cable at the corresponding spaced apart location, thereby altering the reflected monitoring signal;
wherein the system is configured to generate an alert when a reflected monitoring signal deviates from a predicted monitoring signal.

21. The system of claim 20, wherein the at least one flexible engaging member comprises a plurality of laterally extending non-conductive cords connected with the at least one signal carrying cable to form a longitudinally extending web.

* * * * *